United States Patent
Engel et al.

(10) Patent No.: US 6,515,341 B2
(45) Date of Patent: Feb. 4, 2003

(54) MAGNETOELECTRONICS ELEMENT HAVING A STRESSED OVER-LAYER CONFIGURED FOR ALTERATION OF THE SWITCHING ENERGY BARRIER

(75) Inventors: Bradley N. Engel, Chandler, AZ (US); Jason Allen Janesky, Mesa, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/792,466

(22) Filed: Feb. 26, 2001

(65) Prior Publication Data

US 2002/0117727 A1 Aug. 29, 2002

(51) Int. Cl.[7] ............................................... H01L 29/82
(52) U.S. Cl. ..................................................... 257/421
(58) Field of Search ........................ 257/421; 360/326; 438/3; 365/173

(56) References Cited

U.S. PATENT DOCUMENTS

| | | | | |
|---|---|---|---|---|
| 5,640,343 A | * | 6/1997 | Gallagher et al. | 365/171 |
| 5,835,314 A | * | 11/1998 | Moodera et al. | 360/113 |
| 5,920,500 A | * | 7/1999 | Tehrani et al. | 365/173 |
| 6,072,718 A | * | 6/2000 | Abraham et al. | 365/173 |
| 6,111,784 A | * | 8/2000 | Nishimura | 365/173 |
| 6,165,803 A | * | 12/2000 | Chen et al. | 438/3 |
| 6,166,948 A | | 12/2000 | Parkin et al. | |
| 6,269,018 B1 | * | 7/2001 | Monsma et al. | 365/145 |
| 6,292,336 B1 | * | 9/2001 | Horng et al. | 360/324.12 |
| 6,322,640 B1 | * | 11/2001 | Xiao et al. | 148/308 |
| 6,330,137 B1 | * | 12/2001 | Knapp et al. | 360/324.2 |
| 6,331,944 B1 | * | 12/2001 | Monsma et al. | 365/171 |
| 6,341,053 B1 | * | 1/2002 | Nakada et al. | 360/324.2 |
| 6,383,574 B1 | * | 5/2002 | Han et al. | 427/526 |
| 6,429,497 B1 | * | 8/2002 | Nickel | 257/421 |

FOREIGN PATENT DOCUMENTS

EP  0929110 A1  7/1999

OTHER PUBLICATIONS

Yamamoto et al., Magnetic Domain Structure of FE–C/Ni–Fe Multilayers With Insertion of magnetic decoupling BN Layers, Observed by Spin–Polarized SEM, Journal of Magnetism and Magnetic Materials, (1994) Sep. I, Nos. 1/2, pp. 38–44.

* cited by examiner

*Primary Examiner*—Michael Sherry
*Assistant Examiner*—Scott Geyer
(74) *Attorney, Agent, or Firm*—Douglas W. Gilmore; William E. Koch

(57) ABSTRACT

A magnetoelectronics element (40) is provided that is comprised of a first magnetic layer (42), a first tunnel barrier layer (44) on the first magnetic layer (42), a second magnetic layer (46) on the first tunnel barrier layer (44) and a stressed over-layer (48) on the second magnetic layer (46), which is configured to alter a switching energy barrier of the second magnetic layer (46).

31 Claims, 1 Drawing Sheet

MAGNETOELECTRONICS ELEMENT HAVING A STRESSED OVER-LAYER CONFIGURED FOR ALTERATION OF THE SWITCHING ENERGY BARRIER

FIELD OF THE INVENTION

The present invention relates generally to magnetoelectronics, and more particularly to a magnetoelectronics element.

BACKGROUND OF THE INVENTION

Magnetoelectronics, spin electronics and spintronics are synonymous terms for the use of effects predominantly caused by electron spin. Magnetoelectronics is used in numerous information devices, and provides non-volatile, reliable, radiation resistant, and high-density data storage and retrieval. The numerous magnetoelectronics information devices include, but are not limited to, magnetic random access memory (MRAM), magnetic sensors and read/write heads for disk drives.

Generally, a magnetoelectronics information device is constructed with magnetoelectronics elements (e.g., giant magneto resistance (GMR) elements or tunneling magneto resistance (TMR) elements). Efforts are continually made to vary the size and shape of magnetoelectronics elements in order to increase package density. While magnetoelectronics elements tend to operate effectively and efficiently as size is decreased and element aspect ratio is altered, some problems arise with size reduction and alteration of the aspect ratio.

Without intending to be bound by theory, as the dimensions are reduced for a magnetoelectronics element, the energy barrier to element switching (i.e., the energy required to reverse the direction of the magnetic bit of a magnetoelectronics element, which will be referred to herein as the "switching energy barrier") increases. Furthermore, as the aspect ratio of a magnetoelectronics element is reduced, the switching energy barrier decreases. Therefore, size and shape design constraints in the manufacture and use of magnetoelectronics elements have been imposed in order to attain a suitable switching energy barrier.

Accordingly, it is desirable to alter the size and/or aspect ratio while providing a desired switching energy barrier. Furthermore, other desirable features and characteristics of the present invention will become apparent from the subsequent description and the appended claims, taken in conjunction with the accompanying drawings.

BRIEF DESCRIPTION OF THE DRAWINGS

The present invention will hereinafter be described in conjunction with the appended drawing figures, wherein like numerals denote like elements, and.

DETAILED DESCRIPTION OF A PREFERRED EXEMPLARY EMBODIMENT

The following detailed description of a preferred embodiment is merely exemplary in nature and is not intended to limit the invention or the application and uses of the invention. Furthermore, there is no intention to be bound by any theory presented in the preceding background of the invention or the following detailed description of a preferred exemplary embodiment.

Figure 1:
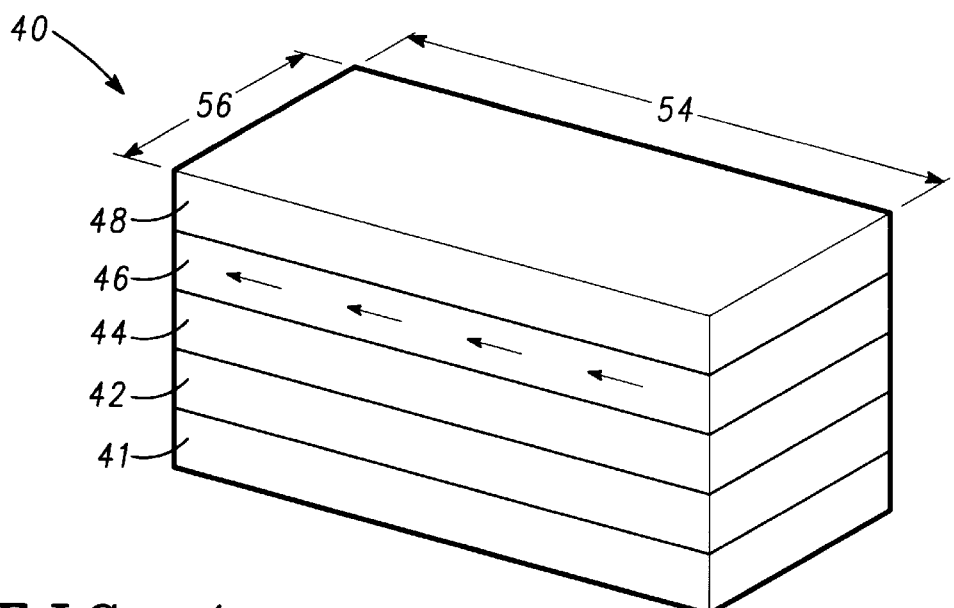
FIG. 1 is an enlarged perspective view of a magnetoelectronics element according to a preferred exemplary embodiment of the present invention.

FIG. 1 illustrates a magnetoelectronics element 40 according to a preferred exemplary embodiment of the present invention. The magnetoelectronics element 40 is preferably a giant magneto resistance (GMR) element or a tunneling magneto resistance (TMR) element, having a first magnetic layer 42 on a substrate 41, a tunnel barrier layer 44 on the first magnetic layer 42, a second magnetic layer 46 on the tunnel barrier layer 44, and a stressed over-layer 48 on the second magnetic layer 46 that is configured to alter the switching energy barrier of the second magnetic layer 46. Preferably, the first magnetic layer 42 is configured as a fixed magnetic layer and the second magnetic layer 46 is configured as a free magnetic layer.

The first magnetic layer 42, tunnel barrier layer 44 and second magnetic layer 46 have rectangular geometric shapes and are formed such that the easy-axis of magnetization is along a first dimension 54 of the magnetoelectronics element 40 (e.g., length) that is greater than a second dimension 56 of the magnetoelectronics element 40 (e.g., width). However, while the magnetoelectronics element 40 is illustrated with each of the layers (42,44,46) having a rectangular geometric shape, the layers (42,44,46) can have any number of geometric shapes, such as ellipsoidal, circular, triangular, pentagonal, octagonal, and hexagonal geometric shapes. In addition, each of the layers (42,44,46) can have substantially the same geometric shape or one or more of the layers (42,44,46) of the magnetoelectronics element 40 can have a different geometric shape.

The first and second magnetic layers (42,46), and any additional magnetic layers, can be formed of any number of magnetic materials, such as nickel (Ni), iron (Fe), cobalt (Co) or alloys thereof. Alternatively, the first and second magnetic layers (42,46), and any additional magnetic layers, can be a composite magnetic material, such as nickel-iron (NiFe), nickel-iron-cobalt (NiFeCo) and cobalt-iron (CoFe) or alloys thereof, for example. The tunnel barrier layer 44, and any additional tunnel barrier layers, is preferably aluminum oxide ($Al_2O_3$), but any number of insulators or semiconductors, such as aluminum nitride or oxides of nickel, iron, cobalt or alloys thereof, can be used in accordance with the present invention.

The stressed over-layer 48 can be formed of any number of materials, but it is preferably formed of a non-magnetic material and more preferably formed of a non-magnetic metal layer. For example, the stressed over-layer 48 can be formed of titanium (Ti), tungsten (W), titanium tungsten (TiW) or alloys thereof in accordance with the present invention. The material of the stressed over-layer 48 is formed with an isotropic stress value that is patterned on tho second magnetic layer 46 to impart an uniaxial stress to alter the switching energy barrier of the second magnetic layer 46. More specifically, the magnetoelastic anisotropic property (i.e., the value of magnetically induced strain that is preferably measured at magnetic saturation, which is referred to as magnetostriction) of the second magnetic layer 46 and the uniaxial stress from patterning of the stressed over-layer 48 on the second magnetic layer 46 is utilized to impart the uniaxial stress in the second magnetic layer 46 that alters the magnetoelastic energy of the second magnetic layer 46 and hence the switching energy barrier of the second magnetic layer 46. This can be utilized to modify the intrinelo switching energy barrier of the second magnetic layer 46 or a switching energy barrier that does not arise from the basic structure and composition of the second magnetic layer 46. In addition, and as will be subsequently described in this detailed description of a preferred exemplary embodiment, the switching energy barrier can be further altered with the selection of the aspect ratio for the magnetoelectronics element 40, where "aspect ratio" shall generally refer to the ratio of the longest dimension of a shape to the shortest dimension of the shape (e.g., the ratio of the first dimension 54 to the second dimension 56), and/or the switching energy barrier can be adjusted to compensate for size, shape and/or aspect ratio constraints of the magnetoelectronics element 40.

The switching energy barrier ($E_{switch}$) of the second magnetic layer 46 can be expressed as:

$$E_{switch} = E_{intrinsic} + E_{shape} + E_{elastic} \quad (1)$$

Where $E_{intrinsic}$ is the intrinsic uniaxial anisotropy of the second magnetic layer, $E_{shape}$ is the shape anisotropy from the aspect ratio and total moment and $E_{elastic}$ is the magnetoelastic energy resulting from the stress imparted in the second magnetic layer 46 and the magnetostriction of the second magnetic layer 46. The magnetoelastic energy ($E_{elastic}$) arising from the stress imparted on the second magnetic layer 46 can be expressed as:

$$E_{elastic} = 3/2 \lambda_s \sigma \sin^2 \theta \quad (2)$$

Where $\lambda_s$ is the isotropic magnetostriction value of the material selected for the second magnetic layer 46, σ is the uniaxial stress provided by the patterning of the stressed over-layer 48 on the second magnetic layer 46, and θ is the angle between the magnetization direction ($M_s$) and the uniaxial stress (σ). As can be appreciated from the foregoing relations provided in equation (1) and equation (2), the tensile or compressive nature of the uniaxial stress on the second magnetic layer 46 in combination with the sign of the isotropic magnetostriction value of the material selected for the second magnetic layer 46 provides a magnetoelastic anisotropy axis that is either substantially parallel or substantially perpendicular to the easy-axis of magnetization, thereby increasing or decreasing the switching energy barrier, respectively.

More specifically, the stressed over-layer 48 can be configured for a positive magnetoelastic energy ($E_{elastic}$) change with a stress that provides a magnetoelastic anisotropy axis, which is substantially parallel to the easy-axis of magnetization, thereby increasing the switching energy barrier. Alternatively, the stressed over-layer 48 can be configured for a negative magnetoelastic energy ($E_{elastic}$) change with a stress that provides a magnetoelastic anisotropy axis, which is substantially perpendicular to the easy-axis, thereby decreasing the switching energy barrier. According to the preferred exemplary embodiment of the present invention, the positive or negative nature of the magnetoelastic energy change can be obtained with one of four combinations for the uniaxial stress (σ) on the second magnetic layer 48 and the sign of the isotropic magnetostriction value ($\lambda_s$) of the material selected for the second magnetic layer 46.

The first of the four combinations is a compressive (+) uniaxial stress (σ) imparted on the second magnetic layer 46 with the patterning of the stressed over-layer 48 and a positive (+) isotropic magnetostriction value ($\lambda_s$) of the material selected for the second magnetic layer 46. This first combination provides a positive change in the magnetoelastic energy ($E_{elastic}$) with a magnetostriction stress having a magnetoelastic anisotropy axis that is substantially parallel to the easy-axis of magnetization or substantially perpendicular to the hard-axis of magnetization for the magnetoelectronics element 40. The second of the four combinations also provides a positive change in the magnetoelastic energy ($E_{elastic}$) with a positive magnetostriction stress having a magnetoelastic anisotropy axis that is substantially parallel to the easy-axis of magnetization or substantially perpendicular to the hard-axis of magnetization for the magnetoelectronics element 40. The second combination is a tensile (−) uniaxial stress imparted on the second magnetic layer 46 with the patterning of the stressed over-layer 48 and a negative (−) isotropic magnetostriction value ($\lambda_s$) of the material selected for the second magnetic layer 46. However, if a negative magnetoelastic energy ($E_{elastic}$) change is desired to decrease the switching energy barrier, the third and fourth combinations for the uniaxial stress (σ) on the second magnetic layer 48 and the sign of the isotropic magnetostriction value ($\lambda_s$) of the material selected for the second magnetic layer 46 are utilized according to the preferred exemplary embodiment of the present invention.

The third of the four combinations is a compressive (+) uniaxial stress imparted on the second magnetic layer 46 with the patterning of the stressed over-layer 48 and a negative (−) isotropic magnetostriction value ($\lambda_s$) of the material selected for the second magnetic layer 46. This third combination provides a negative magnetoelastic energy ($E_{elastic}$) change with a negative magnetostriction stress having a magnetoelastic anisotropy axis that is substantially perpendicular to the easy-axis of magnetization or substantially parallel to the hard-axis of magnetization for the magnetoelectronics element 40.

The fourth of the four combinations provides a magnetoelastic energy ($E_{elastic}$) change with a negative magnetostriction stress having a magnetoelastic anisotropy axis that is substantially perpendicular to the easy-axis of magnetization or substantially parallel to the hard-axis of magnetization for the magnetoelectronics element 40 with a tensile (−) uniaxial stress imparted on the second magnetic layer 46 with the patterning of the stressed over-layer 48 and a positive (+) isotropic magnetostriction value ($\lambda_s$) of the material selected for the second magnetic layer 46. As can be appreciated from the foregoing description of the four combinations, the switching energy barrier of the magnetoelectronics element 40 can be increased or decreased with stressed over-layer 48, and the magnitude of such an increase or decrease in the switching energy barrier can be obtained with the selection of one or both of the magnitudes of the uniaxial stress (σ) and the isotropic magnetostriction value ($\lambda_s$). Furthermore, as previously alluded, the switching energy barrier can be further altered with the selection of an aspect ratio for the magnetoelectronics element 40.

For an aspect ratio of the magnetoelectronics element 40 that is greater than one, the switching energy barrier increases with a reduction in the first dimension 54 and second dimension 56 if the film thickness of the second magnetic layer 46 remains substantially constant. In addition, as the aspect ratio decreases, the switching energy barrier decreases if the total dimension specified by the first dimension 54 and second dimension 56 remains substantially constant. (See U.S. Pat. No. 5,959,880, titled "LOW ASPECT RATIO MAGNETORESISTIVE TUNNELING JUNCTION," issued to Shi et al on Sep. 28, 1999, which is hereby incorporated by reference.) Therefore, as can be appreciated, the switching energy barrier can be further altered with the selection of an aspect ratio and/or size adjustments for the magnetoelectronics element 40.

For example, the magnetoelectronics element 40 can be configured to have an aspect ratio that is greater than one, a reduction in the first dimension 54 and second dimension 56, and a stressed over-layer 48 that provides a negative magnetostriction stress to reduce the increased energy switching barrier resulting from the reduction in the first dimension and second dimension. Alternatively, and as a second example, the magnetoelectronics element 40 can be configured to have a reduced aspect ratio while substantially maintaining the total dimension specified by the first dimension and the second dimension, and a stressed over-layer 48 that provides a positive magnetostriction stress to increase the reduced energy switching barrier resulting from the reduction in the aspect ratio. In this way, the size and shape of the magnetoelectronics element 40 can be adjusted to meet size and shape design constraints while maintaining a suitable switching energy barrier, and can be used in any number of magnetoelectronics devices, including memory.

Figure 2:
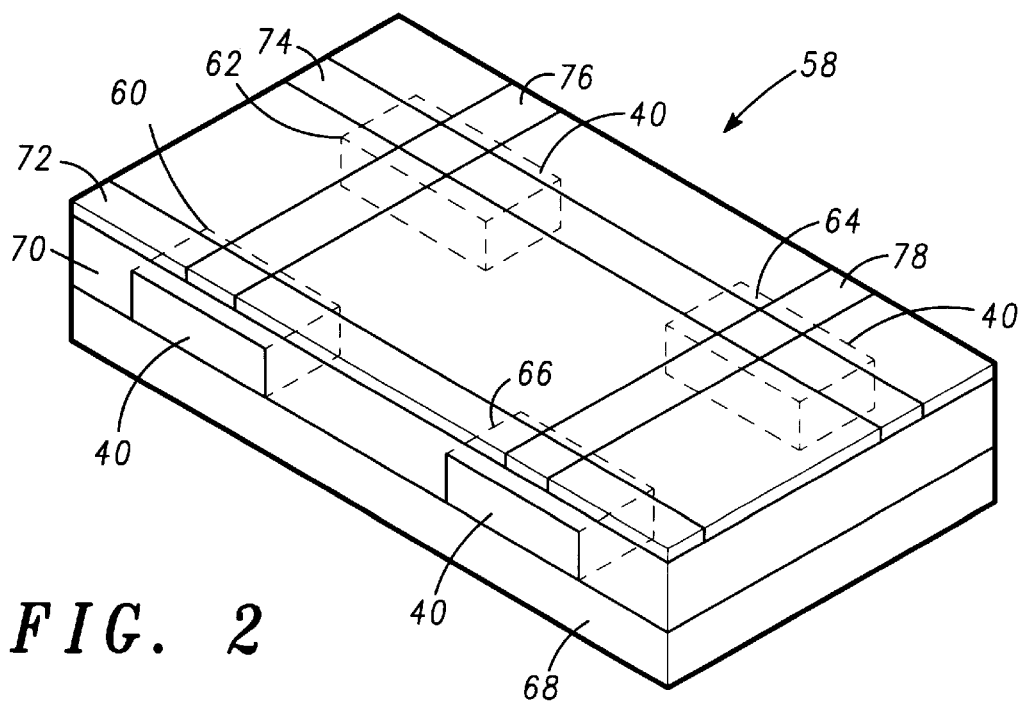
FIG. 2 is an enlarged perspective view of a memory using the magnetoelectronics element of FIG. 1 according to a preferred exemplary embodiment of the present invention.

FIG. 2 illustrates an enlarged perspective view of a portion of a memory 58 that uses the magnetoelectronics element 40 of FIG. 1 for at least one and preferable multiple memory cells according to a preferred exemplary embodiment of the present invention. For example, the memory 58 can be configured to include a first cell 60, a second cell 62, a third cell 64, and a fourth cell 66 that are comprised of the magnetoelectronics element 40 according to a preferred exemplary embodiment of the present invention. The memory 58 also includes a substrate 68 (e.g., a semiconductor substrate) onto which the magnetoelectronics elements 40 are formed to provide the multiple cells (60,62, 64,66). The substrate 68 can also include other circuitry including sense amplifiers and digital circuitry.

A dielectric 70 is applied to at least partially cover the exposed portions of the substrate 68 and the multiple cells (60,62,64,66) formed on the substrate 68. Typically, the multiple cells (60,62,64,66) are formed on the substrate 68 with a space between each of the multiple cells (60,62,64, 66). Conductors (72,74) are then applied to interconnect the magnetoelectronics elements 40 forming the cells (60,62, 64,66) in individual rows. For example, a first conductor 72 is applied between the first cell 60 and the fourth cell 66 to form a first row or sense line, and a second conductor 72 is applied between second cell 62 and third cell 64 in order to form a second row or sense line.

Multiple transverse conductors (76,78) or word lines are applied to the surface of the dielectric 70 overlying the memory cells (60,62,64,66). For example, a transverse conductor 72 or first word line overlays the first cell 60 and second cell 62, and a second transverse conductor 74 or second word line overlays the third cell 64 and fourth cell 66. This configuration provides the basic structure for a spintronic memory device. However, this should not be understood as the only configuration as numerous arrangements and devices are available with the magnetoelectronics element 40.

From the foregoing description, it should be appreciated that a magnetoelectronics element is provided that presents benefits that have been presented in the foregoing background and description and also presents benefits that would be apparent to one skilled in the art. Furthermore, while a preferred exemplary embodiment has been presented in the foregoing description, it should be appreciated that a vast number of variations in the embodiments exist. Lastly, it should be appreciated that these embodiments are preferred exemplary embodiments only, and are not intended to limit the scope, applicability, or configuration of the invention in any way. Rather, the foregoing detailed description provides those skilled in the art with a convenient road map for implementing a preferred exemplary embodiment of the invention. It being understood that various changes may be made in the function and arrangement of elements described in the exemplary preferred embodiment without departing from the spirit and scope of the invention as set forth in the appended claims.

What is claimed is:

1. A magnetoelectronics element, comprising:
   a first magnetic layer;
   a first tunnel barrier layer on said first magnetic layer;
   a second magnetic layer on said first tunnel barrier layer; and
   a stressed over-layer on said second magnetic layer that is configured to alter a switching energy barrier of said second magnetic layer.

2. The magnetoelectronics element of claim 1, wherein said switching energy barrier is an intrinsic switching energy barrier of said second magnetic layer.

3. The magnetoelectronics element of claim 1, wherein said stressed over-layer on said second magnetic layer is a non-magnetic stressed over-layer.

4. The magnetoelectronics element of claim 1, wherein said stressed over-layer on said second magnetic layer is configured to increase said switching energy barrier of said second magnetic layer.

5. The magnetoelectronics element of claim 1, wherein said stressed over-layer on said second magnetic layer is configured to decrease said switching energy barrier of said second magnetic layer.

6. The magnetoelectronics element of claim 1, wherein said stressed over-layer is configured to physically induce a stress on said second magnetic layer to alter said switching energy barrier of said second magnetic layer.

7. The magnetoelectronics element of claim 1, wherein said stressed over-layer is patterned to impart a predetermined uniaxial stress on said second magnetic layer to alter said switching energy barrier of said second magnetic layer.

8. The magnetoelectronics element of claim 1, wherein a magnetoelastic anisotropic property of said second magnetic layer and an uniaxial stress from patterning of said stressed over-layer on said second magnetic layer is utilized to alter said switching energy barrier of said second magnetic layer.

9. The magnetoelectronics element of claim 1, wherein an isotropic magnetorestriction value of a material forming said second magnetic layer is positive and an uniaxial stress due to a patterning of said stressed over-layer on said second magnetic layer is compressive such that a positive magnetoelastic energy change is provided that increases said switching energy barrier of said second magnetic layer.

10. The magnetoelectronics element of claim 1, wherein an isotropic magnetostriction value of a material forming said second magnetic layer is positive and an uniaxial stress due to a patterning of said stressed over-layer on said second magnetic layer is tensile such that a negative magnetoelastic energy change is provided that decreases said switching energy barrier of said second magnetic layer.

11. The magnetoelectronics element of claim 1, wherein an isotropic magnetostriction value of a material forming said second magnetic layer is negative and an uniaxial stress due to a patterning of said stressed over-layer on said second magnetic layer is compressive such that a negative magnetoelastic energy change is provided that decreases said switching energy barrier of said second magnetic layer.

12. The magnetoelectronics element of claim 1, wherein an isotropic magnetostriction value of a material forming said second magnetic layer is negative and an uniaxial stress due to a patterning of said stressed over-layer on said second magnetic layer is tensile such that a positive magnetoelastic energy change is provided that increases said switching energy barrier of said second magnetic layer.

13. The magnetoelectronics element of claim 1, wherein said second magnetic layer has a geometric shape with a longest dimension and a shortest dimension and said longest dimension is greater than said shortest dimension.

14. The magnetoelectronics element of claim 13, wherein said stressed over-layer is configured to alter said switching energy barrier of said second magnetic layer such that a magnetoelastic anisotropy axis is provided that is substantially parallel to said longest dimension.

15. The magnetoelectronics element of claim 1, wherein said first magnetic layer is configured as a fixed magnetic layer.

16. The magnetoelectronics element of claim 1, wherein said second magnetic layer is configured as a free magnetic layer.

17. The magnetoelectronics element of claim 1, wherein said second magnetic layer has an aspect ratio that is selected to further alter said energy switching barrier of said second magnetic layer.

18. The magnetoelectronics element of claim 1, wherein said stressed over-layer is configured for providing a positive magnetostriction stress to increase said switching energy barrier that is altered at least in part due to an alteration in an aspect ratio of said second magnetic layer.

19. The magnetoelectronics element of claim 1, wherein said stressed over-layer is configured for providing a negative magnetostriction stress to reduce said switching energy barrier that is altered at least in part due to an alteration in an aspect ratio of said second magnetic layer.

20. A memory, comprising:
    a substrate; and
    a plurality of magnetoelectronics elements forming memory cells on said substrate, said plurality of magnetoelectronics elements comprising:
        a first magnetic layer;
        a first tunnel barrier layer on said first magnetic layer;
        a second magnetic layer on said first tunnel barrier layer; and
        a stressed over-layer on said second magnetic layer that is configured to alter a switching energy barrier of said second magnetic layer.

21. The memory of claim 20, wherein said switching energy barrier is an intrinsic switching energy barrier of said second magnetic layer.

22. The memory of claim 20, wherein said stressed over-layer on said second magnetic layer is a non-magnetic stressed over-layer.

23. The memory of claim 20, wherein said stressed over-layer on said second magnetic layer is configured to increase said switching energy barrier of said second magnetic layer.

24. The memory of claim 20, wherein said stressed over-layer on said second magnetic layer is configured to decrease said switching energy barrier of said second magnetic layer.

25. The memory of claim 20, wherein said stressed over-layer is configured to physically induce a stress on said second magnetic layer to alter said switching energy barrier of said second magnetic layer.

26. The memory of claim 20, wherein said stressed over-layer is patterned to impart a predetermined uniaxial stress on said second magnetic layer to alter said switching energy barrier of said second magnetic layer.

27. The memory of claim 20, wherein a magnetoelastic anisotropic property of said second magnetic layer and an uniaxial stress from patterning of said stressed over-layer on said second magnetic layer is utilized to alter said switching energy barrier of said second magnetic layer.

28. The memory of claim 20, wherein an isotropic magnetostriction value of a material forming said second magnetic layer is positive and an uniaxial stress due to a patterning of said stressed over-layer on said second magnetic layer is compressive such that a positive magnetoelastic energy change is provided that increases said switching energy barrier of said second magnetic layer.

29. The memory of claim 20, wherein an isotropic magnetostriction value of a material forming said second magnetic layer is positive and an uniaxial stress due to a patterning of said stressed over-layer on said second magnetic layer is tensile such that a negative magnetoelastic energy change is provided that decreases said switching energy barrier of said second magnetic layer.

30. The memory of claim 20, wherein an isotropic magnetostriction value of a material forming said second magnetic layer is negative and an uniaxial stress due to a patterning of said stressed over-layer on said second magnetic layer is compressive such that a negative magnetoelastic energy change is provided that decreases said switching energy barrier of said second magnetic layer.

31. The memory of claim 20, wherein an isotropic magnetostriction value of a material forming said second magnetic layer is negative and an uniaxial stress due to a patterning of said stressed over-layer on said second magnetic layer is tensile such that a positive magnetoelastic energy change is provided that increases said switching energy barrier of said second magnetic layer.

* * * * *

UNITED STATES PATENT AND TRADEMARK OFFICE
CERTIFICATE OF CORRECTION

PATENT NO.   : 6,515,341 B2                                                          Page 1 of 1
DATED        : February 4, 2003
INVENTOR(S)  : Engel et al.

It is certified that error appears in the above-identified patent and that said Letters Patent is hereby corrected as shown below:

<u>Column 1,</u>
Line 5, add as a new first paragraph the following paragraph:
--    This invention was made with Government support under Agreement No. MDA972-96-3-0016 awarded by DARPA. The Government has certain rights in the invention.

Signed and Sealed this

Twenty-first Day of October, 2003

JAMES E. ROGAN
*Director of the United States Patent and Trademark Office*